(12) United States Patent
Nomura

(10) Patent No.: US 9,524,999 B2
(45) Date of Patent: Dec. 20, 2016

(54) IMAGING DEVICE AND ELECTRONIC APPARATUS INCORPORATING A PHASE DIFFERENCE PIXEL

(71) Applicant: Sony Corporation, Tokyo (JP)

(72) Inventor: Hirotoshi Nomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/954,506

(22) Filed: Nov. 30, 2015

(65) Prior Publication Data

US 2016/0086991 A1    Mar. 24, 2016

Related U.S. Application Data

(63) Continuation of application No. 14/311,967, filed on Jun. 23, 2014, now Pat. No. 9,288,380.

(30) Foreign Application Priority Data

Jun. 28, 2013   (JP) ................................ 2013-136217

(51) Int. Cl.
    *H01L 27/146*    (2006.01)
    *H04N 5/232*     (2006.01)
    *H04N 5/369*     (2011.01)
    *H04N 5/3745*    (2011.01)

(52) U.S. Cl.
    CPC ..... *H01L 27/14623* (2013.01); *H01L 27/1463* (2013.01); *H01L 27/1464* (2013.01); *H01L 27/14605* (2013.01); *H01L 27/14612* (2013.01); *H01L 27/14621* (2013.01); *H01L 27/14627* (2013.01); *H04N 5/23212* (2013.01); *H04N 5/3696* (2013.01); *H04N 5/37452* (2013.01); *H04N 5/37457* (2013.01)

(58) Field of Classification Search
    CPC ..................... H01L 27/14623; H04N 5/3696
    USPC .......................................................... 348/302
    See application file for complete search history.

(56) References Cited

U.S. PATENT DOCUMENTS

| | | | | |
|---|---|---|---|---|
| 2011/0156186 | A1* | 6/2011 | Iida ..................... | H01L 27/1463 257/432 |
| 2012/0217601 | A1* | 8/2012 | Miyanami ......... | H01L 27/14621 257/432 |
| 2012/0242874 | A1* | 9/2012 | Noudo ................ | H01L 27/1464 348/294 |
| 2013/0015545 | A1* | 1/2013 | Toumiya ........... | H01L 27/14605 257/432 |

* cited by examiner

Primary Examiner — Usman Khan
(74) Attorney, Agent, or Firm — Sheridan Ross P.C.

(57) ABSTRACT

A solid-state imaging device includes a plurality of pixels each of which includes a photoelectric conversion unit that generates charges by photoelectrically converting light, and a transistor that reads a pixel signal of a level corresponding to the charges generated in the photoelectric conversion unit. A phase difference pixel which is at least a part of the plurality of pixels is configured in such a manner that the photoelectric conversion unit is divided into a plurality of photoelectric conversion units and an insulated light shielding film is embedded in a region for separating the plurality of photoelectric conversion units, which are divided, from each other.

17 Claims, 14 Drawing Sheets

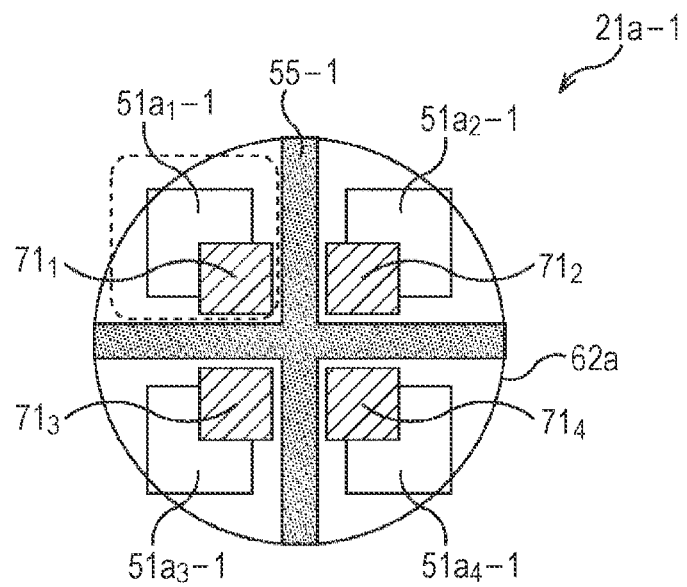
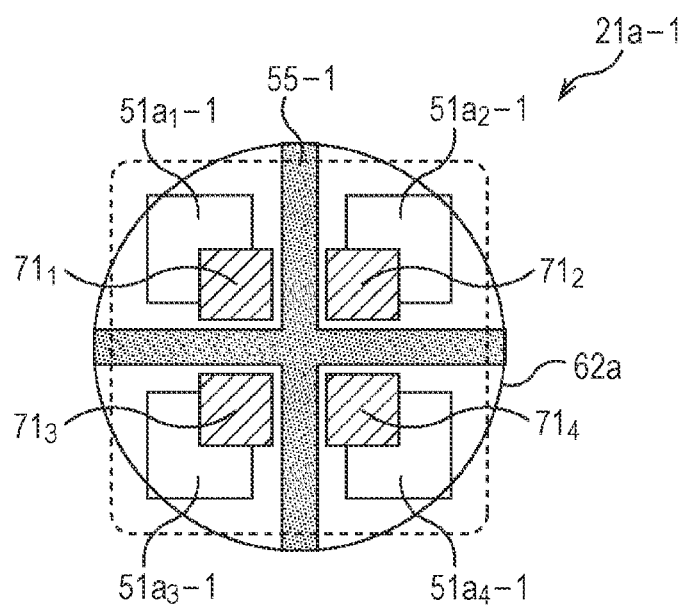

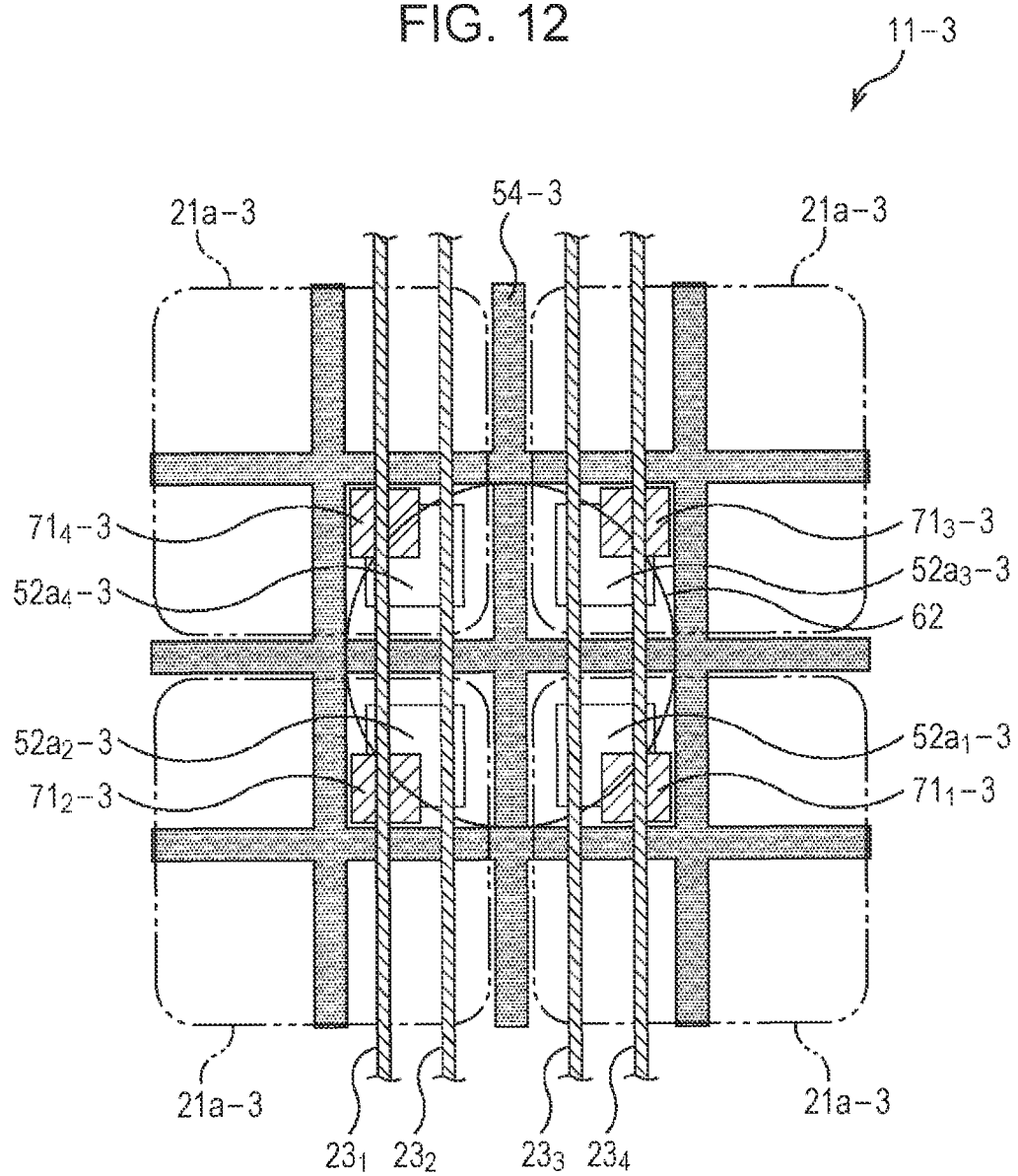

IMAGING DEVICE AND ELECTRONIC APPARATUS INCORPORATING A PHASE DIFFERENCE PIXEL

CROSS REFERENCE TO RELATED APPLICATIONS

This application is a continuation of U.S. patent application Ser. No. 14/311,967, filed Jun. 23, 2014, which claims priority to Japanese Patent Application No. JP 2013-136217, filed Jun. 28, 2013, the entire disclosures of which are hereby incorporated herein by reference.

BACKGROUND

The present disclosure relates to a solid-state imaging device and an electronic apparatus, and in particular, to a solid-state imaging device and an electronic apparatus, capable of obtaining a better phase difference detection accuracy.

In the related art, in an electronic apparatus with an imaging function, such as a digital still camera and a digital video camera, solid-state imaging devices such as, a Charge Coupled Device (CCD) and a Complementary Metal Oxide Semiconductor (CMOS) image sensor are used. The solid-state imaging device includes pixels in each of which a photodiode (PD) performing photoelectric conversion and a plurality of transistors are combined, and an image is formed based on pixel signals which are output from a plurality of the pixels which arranged in a plane manner.

For example, in the solid-state imaging device, charges accumulated in the PD are transferred to a Floating Diffusion (FD) unit having a predetermined capacity which is provided in a connection portion between the PD and a gate electrode of an amplifying transistor. Then, signals corresponding to a level of the charges stored in the FD unit are read from the pixel and AD-converted by an Analog Digital (AD) conversion circuit having a comparator so as to output AD-converted signals.

In recent years, a technology of detecting a phase using a part of an imaging pixel of a CMOS image sensor so as to increase a speed of Autofocus (AF), a so-called image plane phase difference AF, has been widely spread. The image plane phase difference AF includes a one-sided light shielding method and a PD division method.

For example, Japanese Unexamined Patent Application Publication No. 2001-250931 discloses a solid-state imaging device adopting the image plane phase difference AF of the one-sided light shielding method, with which distance measurement is possible by covering approximately a half of the PD with a light shielding film in order for a portion of the light shielding film of a pixel to have a bias with respect to an optical center of a microlens.

Further, Japanese Unexamined Patent Application Publication No. 2000-292685 discloses a solid-state imaging device adopting the image plane phase difference AF of the PD division method, with which distance measurement is possible by dividing the PD in one pixel into two and by obtaining phase information from respective divided PDs.

For example, since the one-sided light shielding method can shield a portion on one side of the pixel by using the light shielding film or the like used in an existing wiring layer or an optical black region, it has been known that a structure can be made easily. Meanwhile, since two imaging pixels as a pair having different opening directions are desired for detecting the phase and it is difficult to obtain pixel values from the imaging pixels, it is necessary to complement pixel values from surrounding pixels.

In contrast, since the PD division method divides one PD into two, only one imaging pixel may be used and the complement of the pixel value may be achieved relatively easily.

SUMMARY

However, in the PD division method, since a plurality of divided PDs for detecting a phase difference are located very close to each other, when light with a great incident angle, among light incident from a microlens, is incident on the PD, the light leaks to the adjacent PD, and thus the phase detection accuracy deteriorates.

The present disclosure is made in view of such circumstances, and is intended to achieve a better phase difference detection accuracy in the PD division method.

According to an embodiment of the present disclosure, there is provided a solid-state imaging device including: a plurality of pixels each of which includes a photoelectric conversion unit that generates charges by photoelectrically converting light; and a transistor that reads a pixel signal of a level corresponding to the charges generated in the photoelectric conversion unit, in which a phase difference pixel which is at least a part of the plurality of pixels is configured in such a manner that the photoelectric conversion unit is divided into a plurality of photoelectric conversion units and an insulated light shielding film is embedded in a region for separating the plurality of photoelectric conversion units, which are divided, from each other.

According to another embodiment of the present disclosure, there is provided an electronic apparatus including: a solid-state imaging device including a plurality of pixels each of which includes a photoelectric conversion unit that generates charges by photoelectrically converting light; and a transistor that reads a pixel signal of a level corresponding to the charges generated in the photoelectric conversion unit, in which a phase difference pixel which is at least a part of the plurality of pixels is configured in such a manner that the photoelectric conversion unit is divided into a plurality of photoelectric conversion units and an insulated light shielding film is embedded in a region for separating the plurality of photoelectric conversion units, which are divided, from each other.

In the embodiments, the phase difference pixel which is at least a part of the plurality of pixels is configured in such a manner that the photoelectric conversion unit is divided into a plurality of photoelectric conversion units and an insulated light shielding film is embedded in a region for separating the plurality of photoelectric conversion units, which are divided, from each other.

According to the embodiments of the present disclosure, it is possible to achieve a better phase difference detection accuracy.

BRIEF DESCRIPTION OF THE DRAWINGS

FIGS. 8A and 8B are diagrams describing a reading of pixel signals from one PD and all PDs;

FIG. 12 is a diagram illustrating a fourth configuration example of the solid-state imaging device;

DETAILED DESCRIPTION OF EMBODIMENTS

Hereinafter, specific embodiments in which the present technology is applied will be described in detail with reference to drawings.

Figure 1:
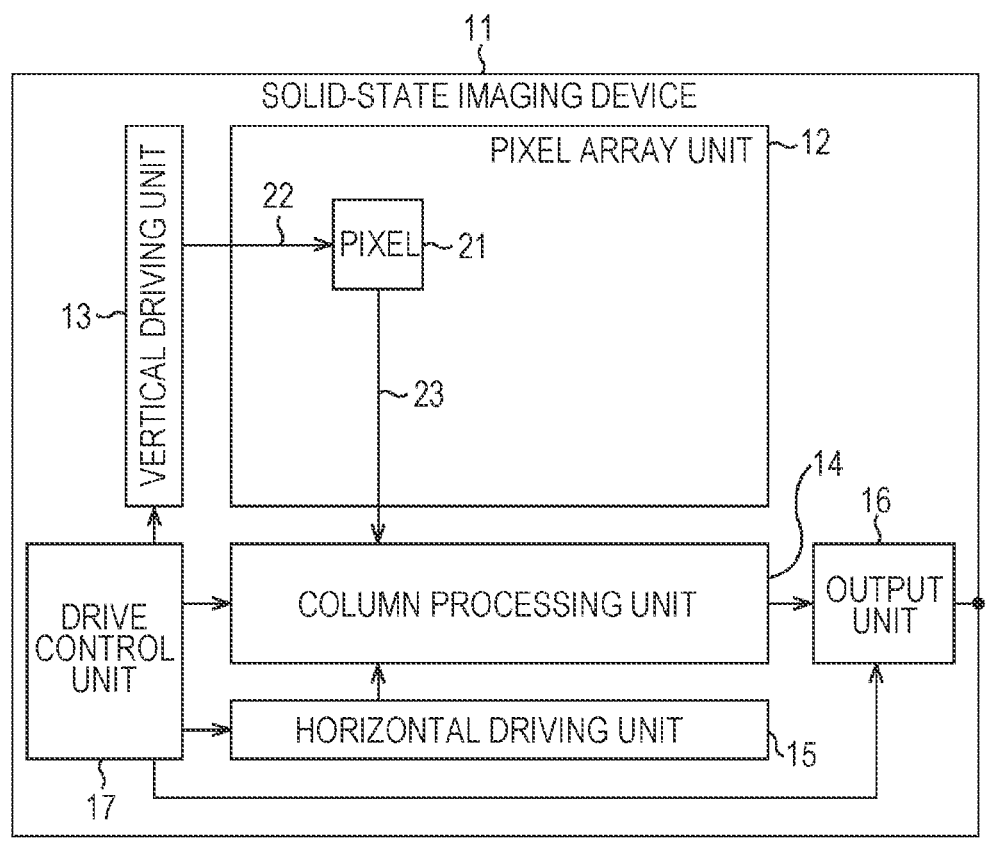
FIG. 1 is a block diagram illustrating a configuration example of a solid-state imaging device according to an embodiment of the present technology.

FIG. 1 is a block diagram illustrating a configuration example of a solid-state imaging device according to an embodiment the present technology.

As illustrated in FIG. 1, a solid-state imaging device 11 is a CMOS-type solid-state imaging device, and is configured to include a pixel array unit 12, a vertical driving unit 13, a column processing unit 14, a horizontal driving unit 15, an output unit 16, and a driving control unit 17.

The pixel array unit 12 includes a plurality of pixels 21 which are arranged in an array shape, is connected to the vertical driving unit 13 through a plurality of horizontal signal lines 22 corresponding to the number of rows of the pixel 21 and is connected to the column processing unit 14 through a plurality of vertical signal lines 23 corresponding to the number of columns of the pixel 21. In other words, the plurality of pixels 21 included in the pixel array unit 12 are respectively disposed at points in which the horizontal signal lines 22 and the vertical signal lines 23 intersect.

The vertical driving unit 13 sequentially supplies drive signals for driving (transferring, selecting, resetting, or the like) the respective pixels 21 to the respective rows of the plurality of pixels 21 included in the pixel array unit 12 through the horizontal signal line 22.

The column processing unit 14 extracts the signal levels of the pixel signals by performing a Correlated Double Sampling (CDS) process on the pixel signals which are output from the respective pixels 21 and acquires pixel data corresponding to the amount of received light of the pixels 21, through the vertical signal line 23.

The horizontal driving unit 15 sequentially supplies the column processing unit 14 with drive signals for outputting the pixel data which is acquired from the respective pixels 21 from the column processing unit 14, for each column of the plurality of pixels 21 included in the pixel array unit 12.

The pixel data is supplied from the column processing unit 14 to the output unit 16 at a timing corresponding to the drive signal of the horizontal driving unit 15, and the output unit 16 amplifies, for example, the pixel data and outputs the amplified pixel data to an image processing circuit in the subsequent stage.

The driving control unit 17 controls the driving of each block in the solid-state imaging device 11. For example, the driving control unit 17 generates a clock signal according to the driving period of each block and supplies the clock signal to each block.

Figure 2A:
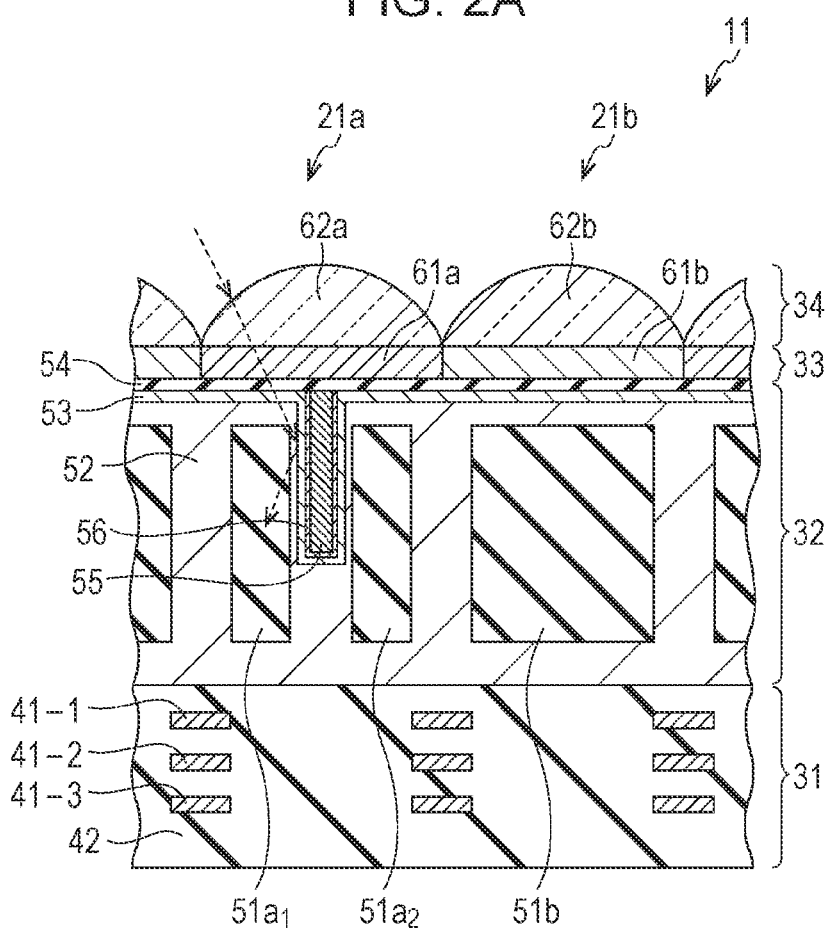
FIGS. 2A and 2B are diagrams illustrating a first configuration example of the solid-state imaging device.
Figure 2B:
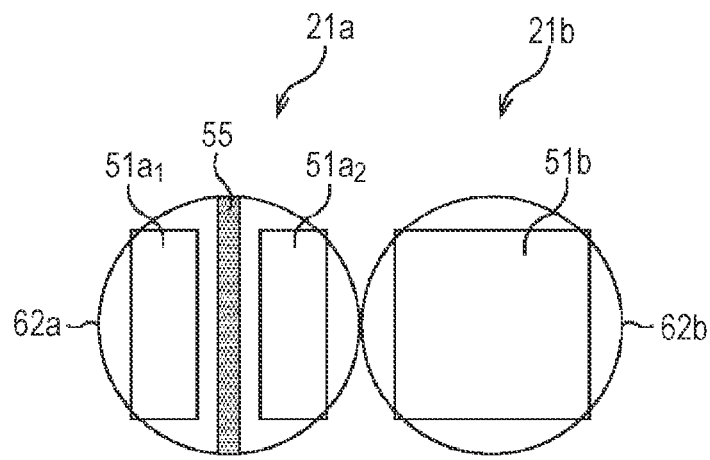

FIGS. 2A and 2B are diagrams illustrating a first configuration example of the solid-state imaging device 11. FIG. 2A illustrates a cross-sectional configuration example of the solid-state imaging device 11 which is the first configuration example, and FIG. 2B illustrates a planar configuration example of the solid-state imaging device 11.

As illustrated in FIGS. 2A and 2B, the solid-state imaging device 11 is configured with a wiring layer 31, a sensor layer 32, a color filter layer 33, and an on-chip lens layer 34 which are laminated. FIGS. 2A and 2B illustrate a pixel 21a capable of outputting a pixel signal used for phase difference detection and a normal pixel 21b outputting only a pixel signal forming an image, among the plurality of pixels 21 disposed in the pixel array unit 12. Hereinafter, appropriately, the pixel 21a and the pixel 21b are respectively referred to as a phase difference pixel 21a and an imaging pixel 21b; and when there is no need to distinguish the pixel 21a and the pixel 21b, they are simply referred to as the pixel 21.

The wiring layer 31 includes a plurality of layers of wirings 41 formed between interlayer insulating films 42, and three layers of wirings 41-1 to 41-3 are formed in the configuration example of FIGS. 2A and 2B.

The sensor layer 32 includes a fixed charge film 53 and an insulating film 54 which are laminated on a semiconductor substrate 52 having PD 51 formed therein.

The PD 51 is formed by a PN junction, generates charges by photo-electrically converting the received light and to accumulate the generated charges. The semiconductor substrate 52 is a silicon substrate (P well) to which P-type impurities are injected. The fixed charge film 53 is a film that stores, for example, negative fixed charges, and suppresses the generation of a dark current at a boundary surface of the semiconductor substrate 52. In addition, an insulating film may be used instead of the fixed charge film 53. The insulating film 54 is a film having an insulating property and insulates the surface of the semiconductor substrate 52.

Further, in the sensor layer 32, one PD 51b is formed in the imaging pixel 21b, whereas two PDs $51a_1$ and $51a_2$ are formed in the phase difference pixel 21a. Then, an engraved light shielding film 55 insulated from the semiconductor substrate 52 is formed between the PDs $51a_1$ and $51a_2$ of the phase difference pixel 21a, in the sensor layer 32, and a barrier metal 56 is formed between the engraved light shielding film 55 and the fixed charge film 53. In other words, as illustrated in FIG. 2B, in the phase difference pixel 21a, the PDs $51a_1$ and $51a_2$ are separately formed, and the engraved light shielding film 55 is formed in a region for separating the PDs $51a_1$ and $51a_2$ from each other in a shape of "I" when viewed in a plan view.

The engraved light shielding film 55 is formed within a trench formed by engraving the semiconductor substrate 52. For example, the trench is formed in the semiconductor substrate 52 between the PDs $51a_1$ and $51a_2$, and the fixed charge film 53 and the barrier metal 56 are applied inside of the trench. Thereafter, the engraved light shielding film 55 is formed by embedding, for example, a metal having a light shielding property in the trench.

The barrier metal 56 is a metal film which is formed for diffusion preventing or interaction preventing of a metal material forming the engraved light shielding film 55.

The color filter layer 33 has a configuration in which filters 61 of predetermined colors, for example, the filters 61 of red, green and blue are arranged in a so-called Bayer array. In FIGS. 2A and 2B, a filter 61a of the color the phase difference pixel 21a receives and a filter 61b of the color the imaging pixel 21b receives are illustrated.

The on-chip lens layer 34 includes a microlens 62 that condenses light incident on the solid-state imaging device 11 to each pixel 21. In FIGS. 2A and 2B, a microlens 62a that condenses the light to the PDs $51a_1$ and $51a_2$ of the phase difference pixel 21a and a microlens 62b that condenses the light to the PD 51b of the imaging pixel 21b are illustrated.

In this manner, the solid-state imaging device 11 is configured in such a manner that the PDs $51a_1$ and $51a_2$ of the phase difference pixel 21a are separated by the engraved light shielding film 55. Thus, in the solid-state imaging device 11, it is possible to prevent the light incident on one of the PDs $51a_1$ and $51a_2$ of the phase difference pixel 21a in an oblique direction from being mixed into the others of the PDs $51a_1$ and $51a_2$ (hereinafter, referred to as optical crosstalk) by the engraved light shielding film 55. In other words, as indicated by an arrow of a dotted line in FIGS. 2A and 2B, for example, reflection of the light incident on the PD $51a_1$ in an oblique direction on the engraved light shielding film 55 and mixing of the light into the PD $51a_2$ are prevented.

Further, in the solid-state imaging device 11, it is possible to prevent the charges generated in one of the PDs $51a_1$ and $51a_2$ of the phase difference pixel 21a from being mixed into the others of the PDs $51a_1$ and $51a_2$ (hereinafter, referred to as electric crosstalk) by the engraved light shielding film 55.

In this manner, in the solid-state imaging device 11, it is possible to prevent the electric crosstalk and the optical crosstalk between the PDs $51a_1$ and $51a_2$ of the phase difference pixel 21a, and to avoid the deterioration of the phase difference characteristic (characteristic of accuracy for detecting a phase difference).

For example, in the solid-state imaging device of the related art, since device isolation for dividing PD is performed by forming a region having a deep P-type impurity concentration, the optical and electric isolation between the divided PDs are weak and the phase difference characteristic is deteriorated. For example, if a wider region having a deep P-type impurity concentration is formed in order to improve the optical and electric isolation of the divided PDs, the area of the PD is reduced. Therefore, it is difficult to obtain a phase difference signal of a high level, in contrast, the influence of noise increases, and thus the phase difference characteristic deteriorates.

In contrast, in the solid-state imaging device 11, since the electric isolation and the optical isolation between the PDs $51a_1$ and $51a_2$ can be strengthened by the engraved light shielding film 55 as compared to the solid-state imaging device of the related art, it is possible to prevent the phase difference characteristic from being deteriorated. Thus, the solid-state imaging device 11 can achieve a better phase difference characteristic.

Further, in the solid-state imaging device 11, the pixel signals which are output from the PDs $51a_1$ and $51a_2$ of the phase difference pixel 21a are added and thus the pixel signals can be used for forming an image. Thus, it is possible to prevent deterioration in an image quality and to obtain an image with higher image quality as compared to a case of complementing a pixel value of the phase difference pixel from the adjacent pixels by the one-sided light shielding method as described above.

Figure 3A:
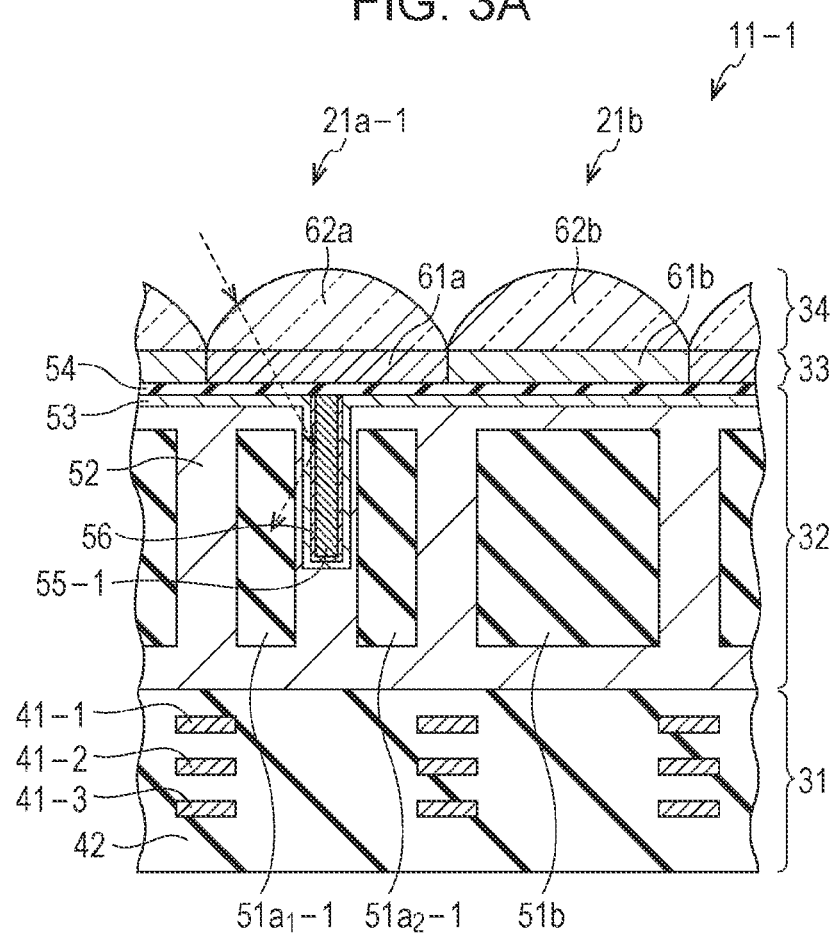
FIGS. 3A and 3B are diagrams illustrating a second configuration example of the solid-state imaging device.
Figure 3B:
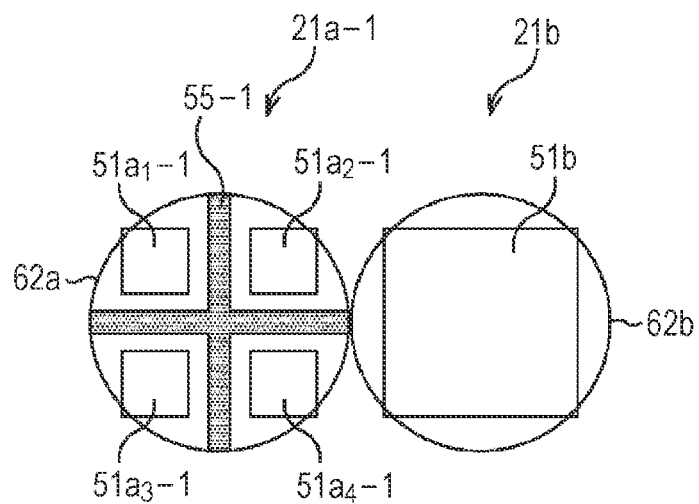

FIGS. 3A and 3B are diagrams illustrating a second configuration example of the solid-state imaging device 11. FIG. 3A illustrates a cross-sectional configuration example of the solid-state imaging device 11-1 which is the second configuration example, and FIG. 3B illustrates a planar configuration example of the solid-state imaging device 11-1.

As illustrated in FIG. 3B, the solid-state imaging device 11-1 has a different configuration from the solid-state imaging device 11 of FIGS. 2A and 2B in that four PDs $51a_1$-1 to $51a_4$-1 are formed in the phase difference pixel 21a-1 and an engraved light shielding film 55-1 is formed in a region for separating the PDs $51a_1$-1 to $51a_4$-1 from each other. In other words, in the solid-state imaging device 11-1, the engraved light shielding film 55-1 is formed into a "cross" shape in a plan view. In addition, otherwise, the solid-state imaging device 11-1 has common components with the solid-state imaging device 11 of FIGS. 2A and 2B, the common components are denoted by the same reference numerals and thus the detailed description thereof will be omitted.

In the solid-state imaging device 11-1 configured in this manner, since the PDs $51a_1$-1 to $51a_4$-1 are separated from each other by the engraved light shielding film 55-1, it is possible to prevent the electric crosstalk and the optical crosstalk between the PDs $51a_1$-1 to $51a_4$-1. Accordingly, the solid-state imaging device 11-1 can achieve a better phase difference characteristic similar to that of the solid-state imaging device 11 of FIGS. 2A and 2B as compared to the solid-state imaging device of the related art. Further, it is possible to detect the phase difference in the oblique direction in the phase difference pixel 21a-1 as will be described with reference to FIGS. 6A and 6B.

Figure 4A:
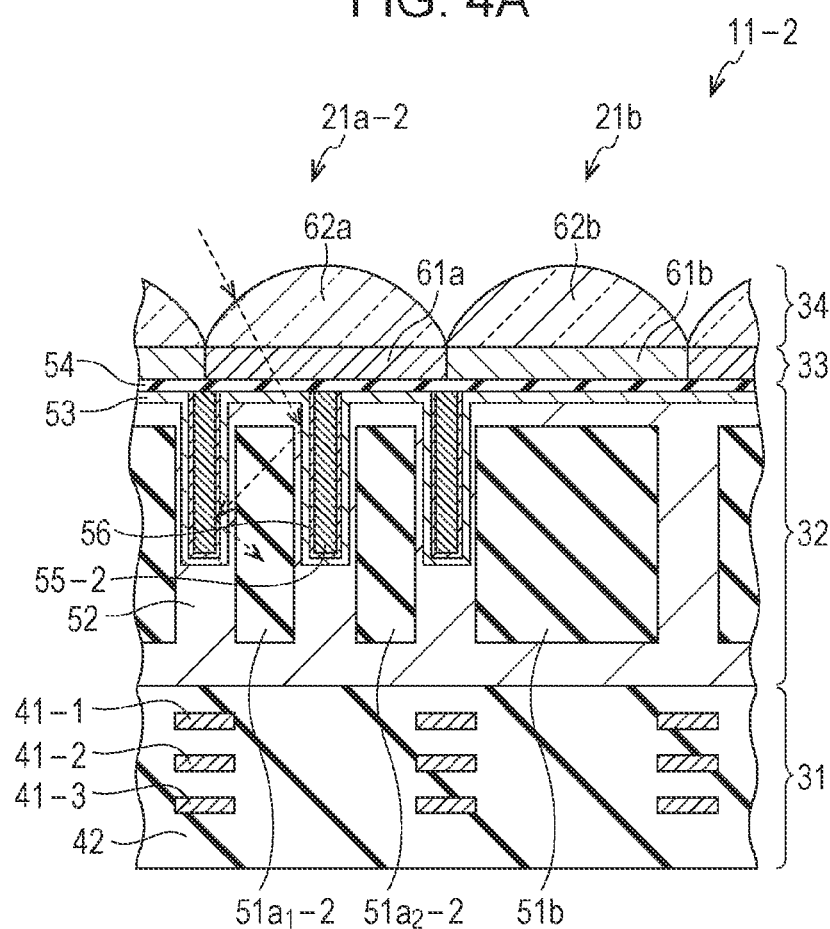
FIGS. 4A and 4B are diagrams illustrating a third configuration example of the solid-state imaging device.
Figure 4B:
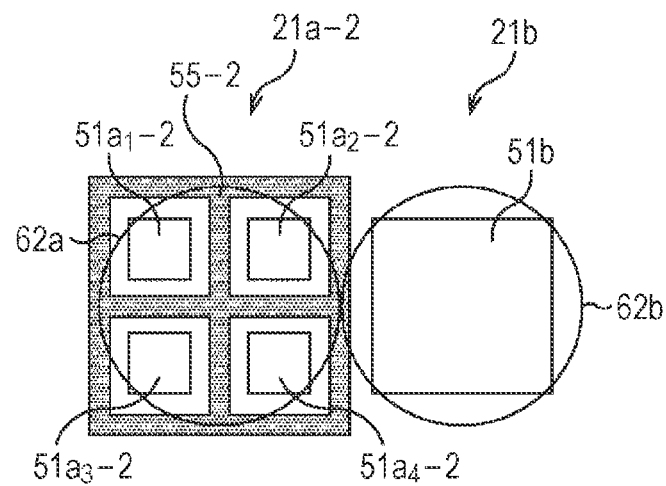

FIGS. 4A and 4B are diagrams illustrating a third configuration example of the solid-state imaging device 11. FIG. 4A illustrates a cross-sectional configuration example of the solid-state imaging device 11-2 which is the third configuration example, and FIG. 4B illustrates a planar configuration example of the solid-state imaging device 11-2.

As illustrated in FIG. 4B, the solid-state imaging device 11-2 has a different configuration from the solid-state imaging device 11 of FIGS. 2A and 2B in that four PDs $51a_1$-2 to $51a_4$-2 are formed in the phase difference pixel 21a-2 and an engraved light shielding film 55-2 is formed in a region for separating the PDs $51a_1$-2 to $51a_4$-2 from each other and separating the phase difference pixel 21a-2 and other adjacent pixels 21. In other words, in the solid-state imaging device 11-2, the engraved light shielding film 55-2 is formed into a "square with cross in the center" shape in a plan view. In addition, otherwise, the solid-state imaging device 11-2 has common components with the solid-state imaging device 11 of FIGS. 2A and 2B, the common components are denoted by the same reference numerals and thus the detailed description thereof will be omitted.

In the solid-state imaging device 11-2 configured in this manner, since the PDs $51a_1$-2 to $51a_4$-2 are separated from each other by the engraved light shielding film 55-2, it is possible to prevent the electric crosstalk and the optical crosstalk between the PDs $51a_1$-2 to $51a_4$-2. Further, in the solid-state imaging device 11-2, it is possible to prevent the electric crosstalk and the optical crosstalk between the PDs $51a_1$-2 to $51a_4$-2 and the PD 51b of the adjacent imaging pixel 21b by the engraved light shielding film 55-2. Accordingly, the solid-state imaging device 11-2 can achieve a better phase difference characteristic similar to that of the solid-state imaging device 11 of FIGS. 2A and 2B as compared to the solid-state imaging device of the related art.

Further, in the phase difference pixel 21*a*-2, a white filter 61*a* is disposed corresponding to the phase difference pixel 21*a*-2 in the color filter layer 33. In this manner, it is possible to increase the received light amount of the PDs 51*a*$_1$-2 to 51*a*$_4$-2 and to improve the sensitivity of the pixel signals output by the PDs 51*a*$_1$-2 to 51*a*$_4$-2, by applying the white filter 61*a* to the phase difference pixel 21*a*-2. Thus, the solid-state imaging device 11-2 can achieve a better phase difference characteristic.

Next, reading of the pixel signals from the phase difference pixel 21*a*-1 will be described with reference to FIGS. 5A and 5B to FIG. 9.

Figure 5A:
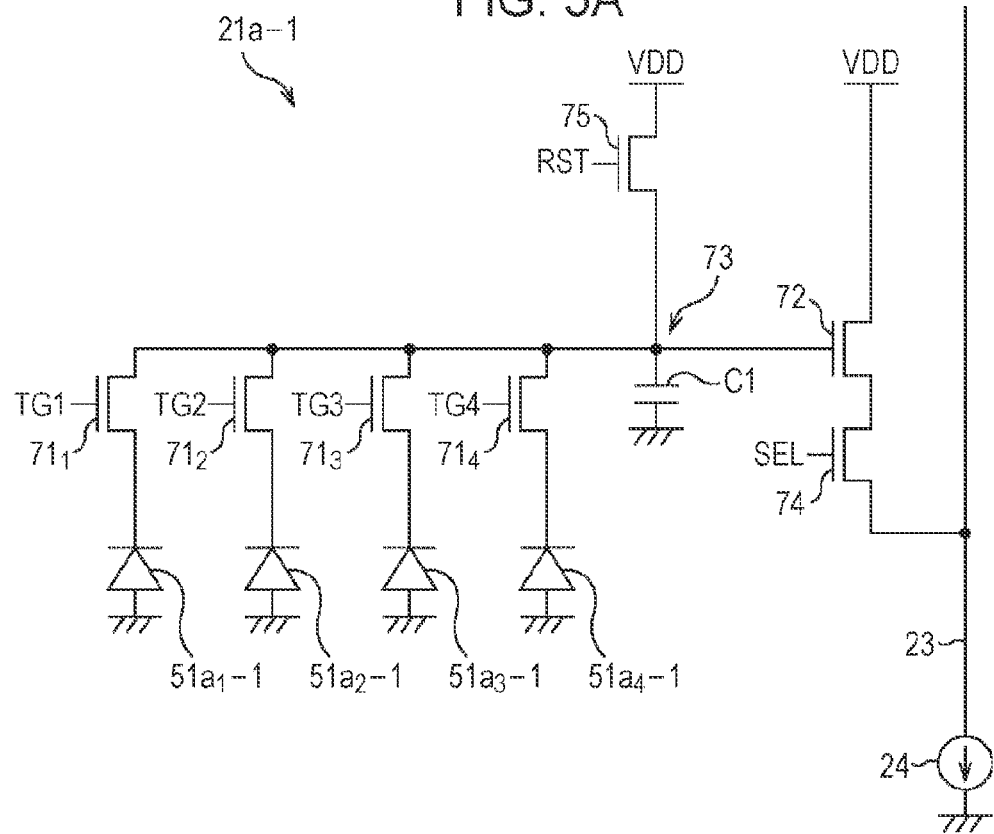
FIGS. 5A and 5B are diagrams illustrating a reading of pixel signals from phase difference pixels.
Figure 5B:
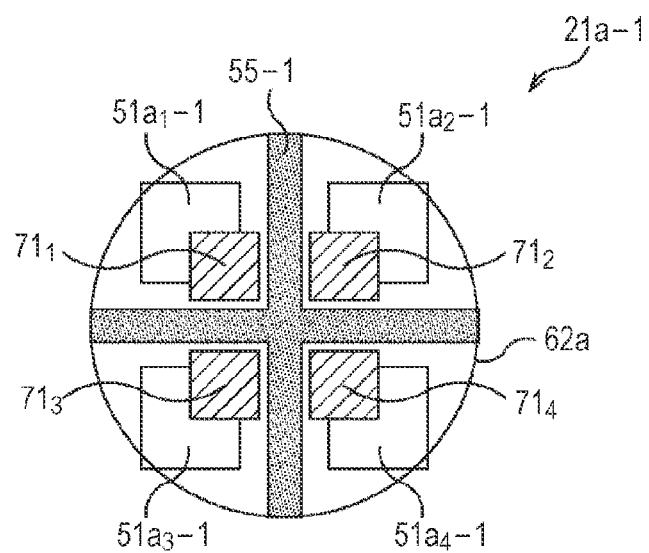

FIG. 5A illustrates a circuit configuration of the phase difference pixel 21*a*-1, and FIG. 5B illustrates a planar configuration example of the phase difference pixel 21*a*-1.

As illustrated in FIG. 5A, the phase difference pixel 21*a*-1 is configured to include PDs 51*a*$_1$-1 to 51*a*$_4$-1, transfer transistors 71$_1$ to 71$_4$, an amplifying transistor 72, an FD unit 73, a selection transistor 74, and a reset transistor 75, and is connected to a current source 24 through a vertical signal line 23.

Further, as illustrated in FIG. 5B, one microlens 62*a* is shared with the PDs 51*a*$_1$-1 to 51*a*$_4$-1, and the transfer transistors 71$_1$ to 71$_4$ are disposed on the center side of the phase difference pixel 21*a*-1.

The PDs 51*a*$_1$-1 to 51*a*$_4$-1 are configured in such a manner that the anode electrodes are grounded and the cathode electrodes are respectively connected to the gate electrode of the amplifying transistor 72 through the transfer transistors 71$_1$ to 71$_4$.

The transfer transistors 71$_1$ to 71$_4$ are respectively driven according to the transfer signals TG1 to TG4 which are supplied from the vertical driving unit 13 of FIG. 1. For example, if the transfer signals TG1 to TG4 supplied to the gate electrodes of the transfer transistors 71$_1$ to 71$_4$ are at a high level, the transfer transistors 71$_1$ to 71$_4$ are turned ON. Thus, the charges accumulated in the PDs 51*a*$_1$-1 to 51*a*$_4$-1 are transferred to the FD unit 73 through the transfer transistors 71$_1$ to 71$_4$.

The amplifying transistor 72 is an input portion of a source follower which is a reading circuit that reads signals obtained by the photoelectric conversion in the PDs 51*a*$_1$-1 to 51*a*$_4$-1, and outputs pixel signals of a level corresponding to the charges accumulated in the FD unit 73 to the vertical signal line 23. In other words, the amplifying transistor 72 constitutes the source follower with the current source 24 connected to one end of the vertical signal line 23 by the drain electrode of the amplifying transistor 72 being connected to the power supply voltage VDD and the source electrode thereof being connected to the vertical signal line 23 through the selection transistor 74.

The FD unit 73 is a floating diffusion region having a capacitance C1 provided between the transfer transistors 71$_1$ to 71$_4$ and the amplifying transistor 72, and temporarily accumulates charges that are transferred from the PDs 51*a*$_1$-1 to 51*a*$_4$-1 through the transfer transistors 71$_1$ to 71$_4$. The FD unit 73 is a charge detection unit that converts charges into a voltage, and the charges accumulated in the FD unit 73 are converted into a voltage in the amplifying transistor 72.

The selection transistor 74 is driven according to a selection signal SEL supplied from the vertical driving unit 13 of FIG. 1, and when the selection signal SEL supplied to the gate electrode is at a high level, the selection transistor 74 is turned ON and connected to the amplifying transistor 72 and the vertical signal line 23.

The reset transistor 75 is driven according to a reset signal RST supplied from the vertical driving unit 13 of FIG. 1. For example, when the reset signal RST supplied to the gate electrode is at a high level, the reset transistor 75 is turned ON, and the charges accumulated in the FD unit 73 are discharged into the power supply voltage VDD to reset the FD unit 73.

The phase difference pixel 21*a*-1 configured in this manner can independently read charges from the PDs 51*a*$_1$-1 to 51*a*$_4$-1 and output pixel signals of levels corresponding to respective charges. Then, for example, in the phase difference pixel 21*a*-1, a phase difference in an oblique direction is detected based on the pixel signals corresponding to charges which are independently read from a pair of PDs 51*a* disposed in the oblique direction.

Figure 6A:
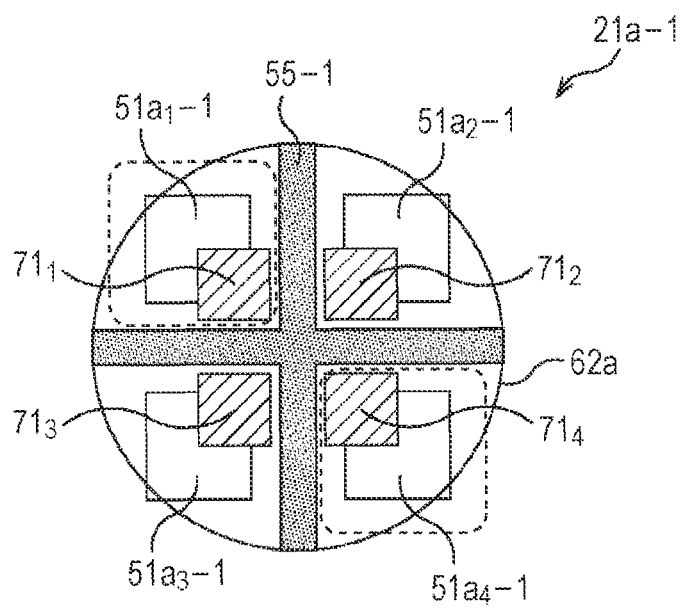
FIGS. 6A and 6B are diagrams illustrating a detection of a phase difference in an oblique direction.
Figure 6B:
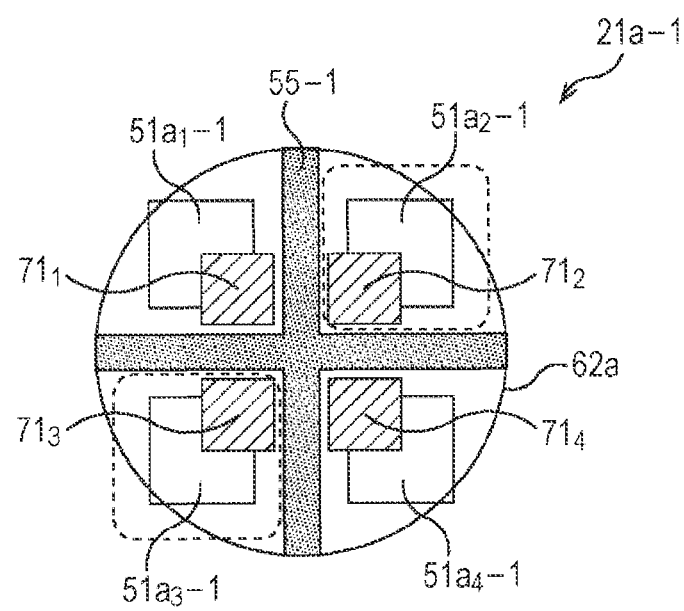

In FIGS. 6A and 6B, the PD 51 from which pixel signals are read is indicated by being surrounded by dotted lines. For example, as illustrated in FIG. 6A, it is possible to detect a phase difference of an oblique direction from the upper left to the lower right by independently transferring the charges of the PD 51*a*$_1$-1 and the PD 51*a*$_4$-1 which are disposed in an oblique direction to the FD unit 73 and reading the respective pixel signals. Similarly, as illustrated in FIG. 6B, it is possible to detect a phase difference of an oblique direction from the upper right to the lower left by independently transferring the charges of the PD 51*a*$_2$-1 and the PD 51*a*$_3$-1 which are disposed in an oblique direction to the FD unit 73 and reading the respective pixel signals.

Further, in the phase difference pixel 21*a*-1, it is possible to detect a phase difference in a vertical direction and a horizontal direction.

Figure 7A:
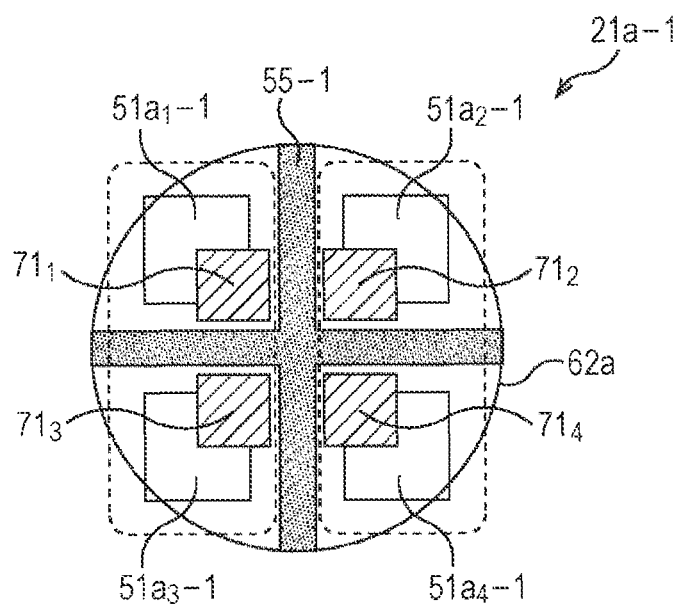
FIGS. 7A and 7B are diagrams illustrating a detection of a phase difference in a vertical direction and a horizontal direction.
Figure 7B:
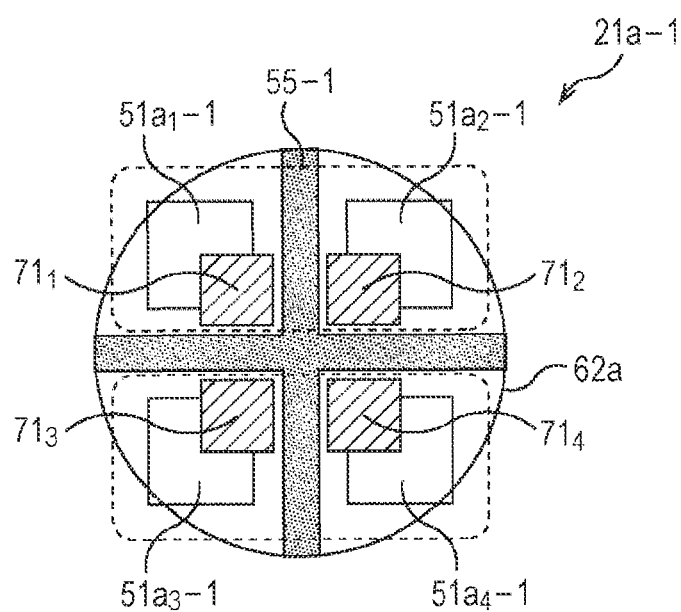

In FIGS. 7A and 7B, the PD 51 from which pixel signals are read is indicated by being surrounded by dotted lines. For example, as illustrated in FIG. 7A, it is possible to detect a phase difference in the horizontal direction by independently transferring the charges of the PD 51*a*$_1$-1 and the PD 51*a*$_3$-1 and the charges of the PD 51*a*$_2$-1 and the PD 51*a*$_4$-1 to the FD unit 73 and reading the respective pixel signals. Similarly, as illustrated in FIG. 7B, it is possible to detect a phase difference in the vertical direction by independently transferring the charges of the PD 51*a*$_1$-1 and the PD 51*a*$_2$-1 and the charges of the PD 51*a*$_3$-1 and the PD 51*a*$_4$-1 to the FD unit 73 and reading the respective pixel signals.

Further, in the phase difference pixel 21*a*-1, any one of the PDs 51*a*$_1$-1 to 51*a*$_4$-1, for example, as illustrated in FIG. 8A, the charges of only the PD 51*a*$_1$-1 may be transferred to the FD unit 73 and the pixel signals may be read.

Further, as illustrated in FIG. 8B, in the phase difference pixel 21*a*-1, all charges of the PDs 51*a*$_1$-1 to 51*a*$_4$-1 are simultaneously transferred to the FD unit 73, the charges are added in the FD unit 73, and the pixel signals may be read. In this manner, the pixel signals obtained by adding all charges of the PDs 51*a*$_1$-1 to 51*a*$_4$-1 can be used as the pixel signals forming an image, similarly to the pixel signals output by the imaging pixel 21*b*. In addition, even in the phase difference pixel 21*a* of FIGS. 2A and 2B, similarly, the charges of the PDs 51*a*$_1$ to 51*a*$_2$ are simultaneously transferred to the FD unit, the charges are added in the FD unit, and the pixel signals can be read.

However, in the phase difference pixel 21*a*-1, a gain when the amplifying transistor 72 amplifies the charges accumulated in the FD unit 73 depends on the capacitance of the FD unit 73.

Therefore, for example, when the capacitance of the FD unit 73 is set in order to obtain a suitable gain for the charge amount at a time of transferring charges of any one of the PDs $51a_1$-1 to $51a_4$-1 (hereinafter, appropriately, referred to as a time of reading one pixel), there is a concern that when all charges of the PDs $51a_1$-1 to $51a_4$-1 are simultaneously transferred to the FD unit 73 (hereinafter, appropriately, referred to as a time of adding all pixels to the FD), the charge amount exceeds the capacitance of the FD unit 73. Thus, the phase difference pixel 21a-1 is configured to be capable of switching the capacitance of the FD between at the time of reading one pixel and at the time of adding all pixels to the FD, and thus it is possible to prevent the charges from exceeding the capacitance of the FD unit 73.

Figure 9:
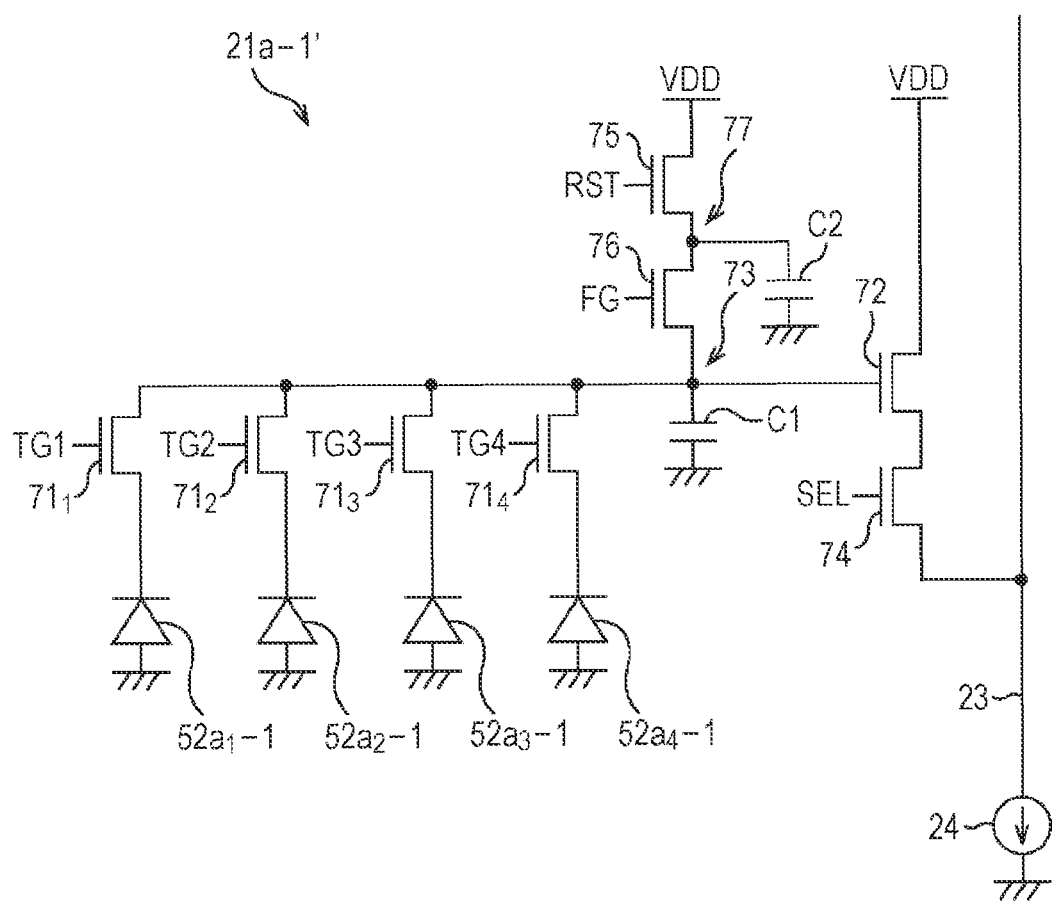
FIG. 9 is a diagram illustrating a modified example of the phase difference pixel.

In other words, FIG. 9 illustrates a modified example of the phase difference pixel 21a-1.

As illustrated in FIG. 9, the phase difference pixel 21a-1' is configured to include PDs $51a_1$-1 to $51a_4$-1, transfer transistors $71_1$ to $71_4$, an amplifying transistor 72, an FD unit 73, a selection transistor 74, a reset transistor 75, a switching transistor 76, and an FD unit 77. In other words, the phase difference pixel 21a-1' is different from the phase difference pixel 21a-1 of FIGS. 5A and 5B in that it includes the switching transistor 76 and the FD unit 77.

The switching transistor 76 is disposed to be connected to the FD unit 73 and the reset transistor 75, and the FD unit 77 is provided in a connection portion between the switching transistor 76 and the reset transistor 75. The FD unit 77 is a floating diffusion region including a capacitance C2. Then, the switching transistor 76 is driven according to a switching signal FG supplied from the vertical driving unit 13 of FIG. 1, and when the switching signal FG is at a high level, the switching transistor 76 is turned ON and the FD unit 73 and the FD unit 77 are connected. In this manner, the capacitance of accumulation of charges transferred from the PDs $51a_1$-1 to $51a_4$-1 is switched by the switching transistor 76, and thus it is possible to switch the conversion efficiency for converting the charges into a voltage.

Accordingly, at the time of reading one pixel, the switching transistor 76 is turned OFF, the charges respectively generated in the PDs $51a_1$-1 to $51a_4$-1 are accumulated in the capacitance C1 of the FD unit 73. Accordingly, it is possible to accumulate charges with a small capacitance and to convert the charges into a voltage with high conversion efficiency.

Meanwhile, at the time of adding all pixels to the FD, the switching transistor 76 is turned ON, and thus the FD unit 73 and the FD unit 77 are connected, the charges generated in the PDs $51a_1$-1 to $51a_4$-1 are simultaneously accumulated with the capacitance obtained by adding the capacitance C1 of the FD unit 73 and the capacitance C2 of the FD unit 77, and the charges are added. Accordingly, it is possible to accumulate charges with a great capacitance and to convert the charges into a voltage with low conversion efficiency.

Thus, at the time of reading one pixel, it is possible to convert the charges into a pixel signal with high gain; and at the time of adding all pixels to the FD, it is possible to prevent the overflow of charges.

In addition, the phase difference pixel 21a of respective configuration examples described above can be partially or entirely disposed in the pixel array unit 12 of FIG. 1.

Figure 10A:
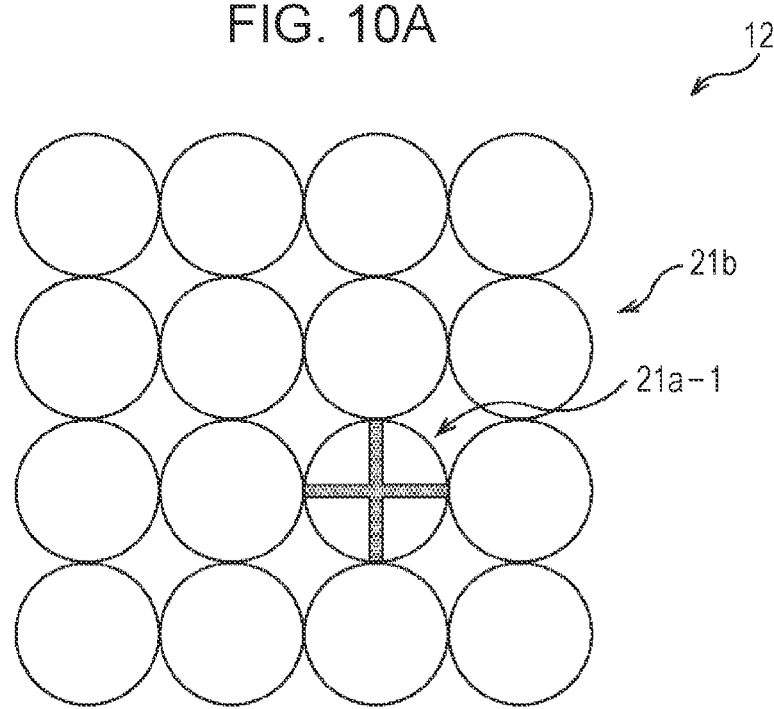
FIGS. 10A and 10B are diagrams illustrating a part of a pixel array unit in which the phase difference pixel is partially disposed.
Figure 10B:
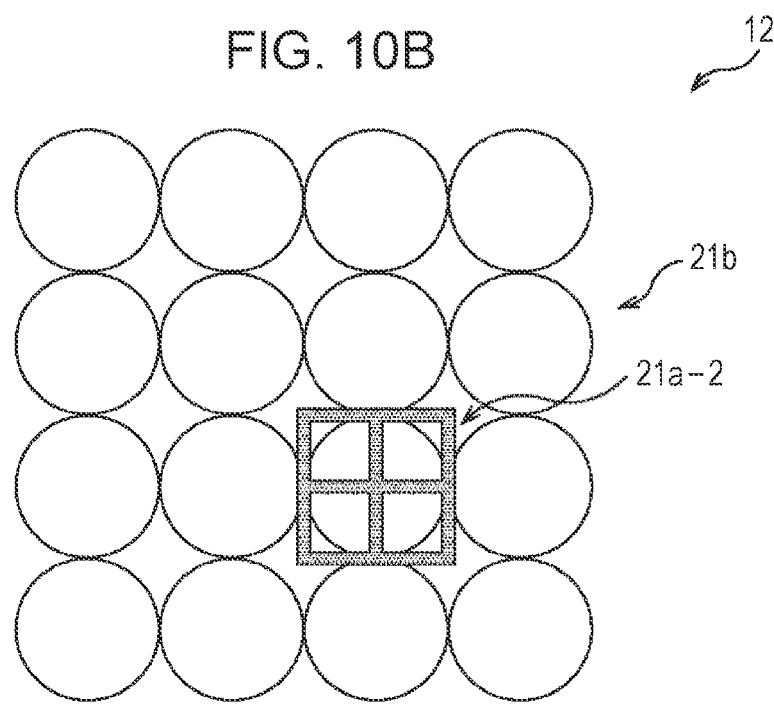

FIGS. 10A and 10B illustrate a part of the pixel array unit 12 in which the phase difference pixel 21a is partially disposed.

In the pixel array unit 12 illustrated in FIG. 10A, the phase difference pixel 21a-1 illustrated in FIGS. 3A and 3B is partially disposed and imaging pixels 21b are disposed other than the phase difference pixel 21a-1. Further, in the pixel array unit 12 illustrated in FIG. 10B, the phase difference pixel 21a-2 illustrated in FIGS. 3A and 3B is partially disposed and imaging pixels 21b are disposed other than the phase difference pixel 21a-1.

Figure 11A:
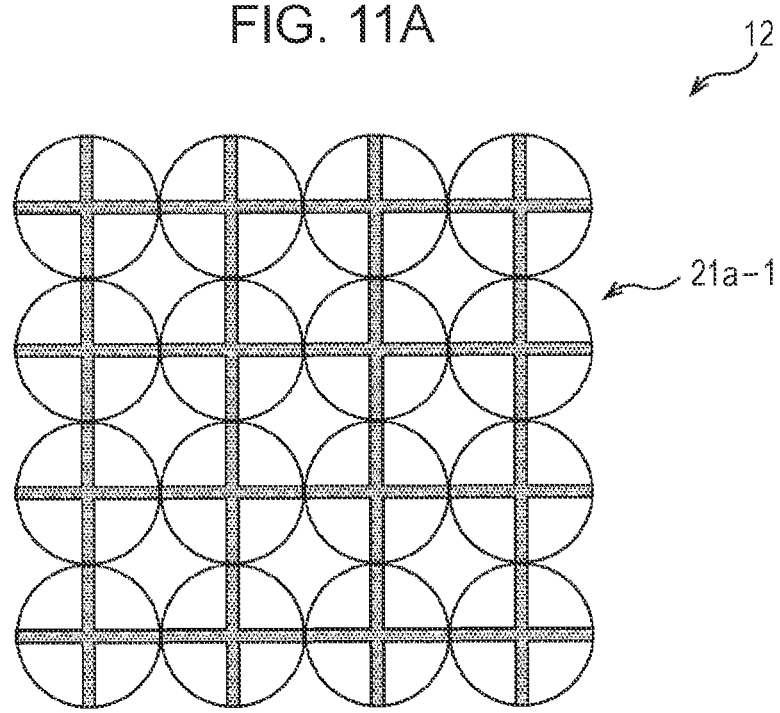
FIGS. 11A and 11B are diagrams illustrating a part of a pixel array unit in which the phase difference pixels are entirely disposed.
Figure 11B:
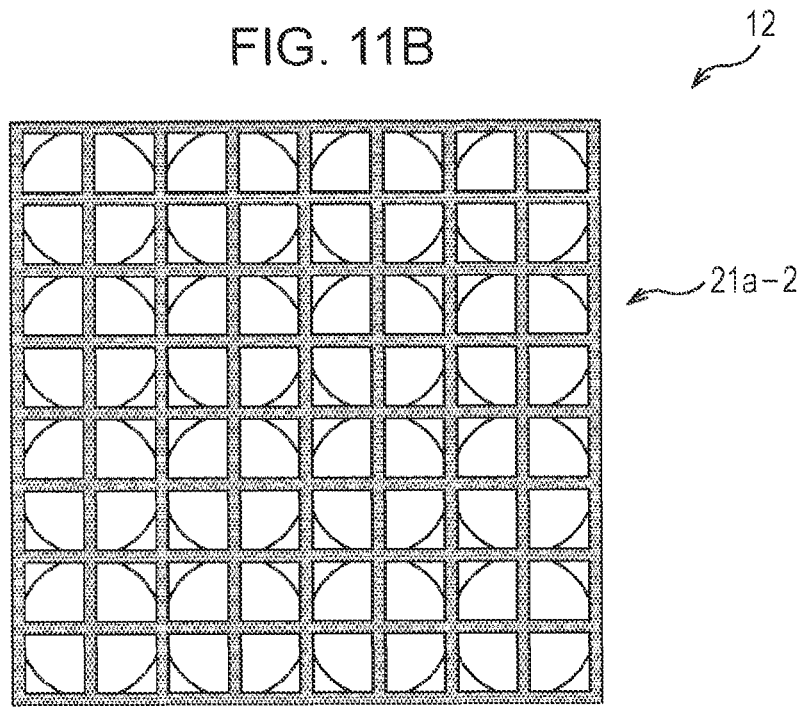

FIGS. 11A and 11B illustrate a part of the pixel array unit 12 in which the phase difference pixels 21a are entirely disposed.

In the pixel array unit 12 illustrated in FIG. 11A, the phase difference pixels 21a-1 illustrated in FIGS. 3A and 3B are entirely disposed. Further, in the pixel array unit 12 illustrated in FIG. 11B, the phase difference pixels 21a-2 illustrated in FIGS. 3A and 3B are entirely disposed.

As illustrated in FIGS. 11A and 11B, it is possible to detect a phase difference in all phase difference pixels 21a, by the solid-state imaging device 11 including the pixel array unit 12 in which the phase difference pixels 21a are entirely disposed, and to form an image from the pixel signals which are output from all phase difference pixels 21a. Further, in the pixel array unit 12 in which the phase difference pixels 21a are entirely disposed, it is possible to receive light from a plurality of directions by one phase difference pixel 21a and to output the pixel signals corresponding to the light from the respective directions. Thus, it is possible to obtain a stereoscopic image (3D image) by independently outputting the pixel signal corresponding to the light from the respective directions and forming a plurality of images for each of the respective directions of light.

Further, as illustrated in FIGS. 10A and 10B, it is possible to improve pixel sensitivity in the pixel array unit 12 in which the phase difference pixel 21a is partially disposed, as compared to the pixel array unit 12 in which the phase difference pixels 21a of FIGS. 11A and 11B are entirely disposed. In addition, although not being illustrated, the phase difference pixel 21a of FIGS. 2A and 2B may be partially or entirely disposed in the pixel array unit 12 as illustrated in FIGS. 10A, 10B, 11A and 11B.

Next, FIG. 12 is a diagram illustrating a fourth configuration example of the solid-state imaging device 11, and FIG. 12 illustrates a planar configuration example of the solid-state imaging device 11-3 which is the fourth configuration example.

As illustrated in FIG. 12, the solid-state imaging device 11-3 is configured in such a manner that the phase difference pixels 21a-3 are entirely disposed in the pixel array unit 12, as illustrated in FIGS. 11A and 11B described above. Then, in the phase difference pixel 21a-3, similarly to the phase difference pixel 21a-2 of FIGS. 4A and 4B, the engraved light shielding film 55-3 is formed in a region for separating four PDs $51a_1$-3 to $51a_4$-3 from each other included in the phase difference pixel 21a-3 and separating the phase difference pixel 21a-2.

Further, in the solid-state imaging device 11-3, the microlens 62 is disposed while being shifted by a ½ pixel in the vertical direction and the horizontal direction relative to the phase difference pixel 21a-3. In other words, the solid-state imaging device 11-3 is configured in such a manner that one microlens 62 is shared with the PDs $51a_1$-3 to $51a_4$-3 respectively included in four adjacent phase difference pixels 21a-3.

In other words, FIG. 12 illustrates four phase difference pixels 21a-3, and the microlens 62 is shared with the PD $51a_4$-3 disposed in a lower right part of an upper left phase difference pixel 21a-3, the PD $51a_3$-3 disposed in a lower left part of an upper right phase difference pixel 21a-3, the PD $51a_2$-3 disposed in an upper right part of a lower left phase difference pixel 21a-3, and the PD 51a₁-3 disposed in an upper left part of a lower right phase difference pixel 21a-3.

Further, the solid-state imaging device 11-3 is configured in such a manner that four vertical signal lines 23₁ to 23₄ are disposed at each phase difference pixel 21a-3. Accordingly, in the solid-state imaging device 11-3, a pixel signal based on charges generated in the four PDs 51a₁-3 to 51a₄-3 included in the phase difference pixel 21a-3 can be simultaneously read by the four vertical signal lines 23₁ to 23₄. In this manner, it is possible to speed up the reading of the pixel signal in the solid-state imaging device 11-3, by reading independently and in a parallel manner the pixel signal based on charges generated in the PDs 51a₁-3 to 51a₄-3.

Figure 13A:
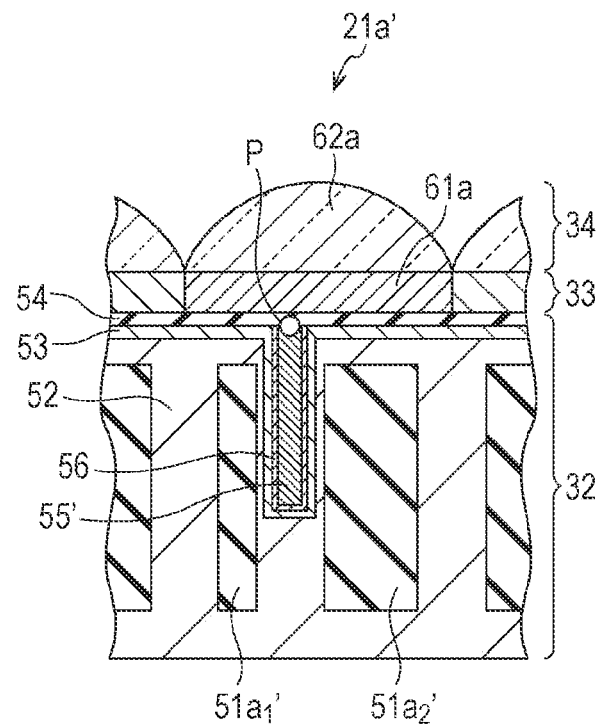
FIGS. 13A and 13B are diagrams illustrating a modified example of the phase difference pixel.
Figure 13B:
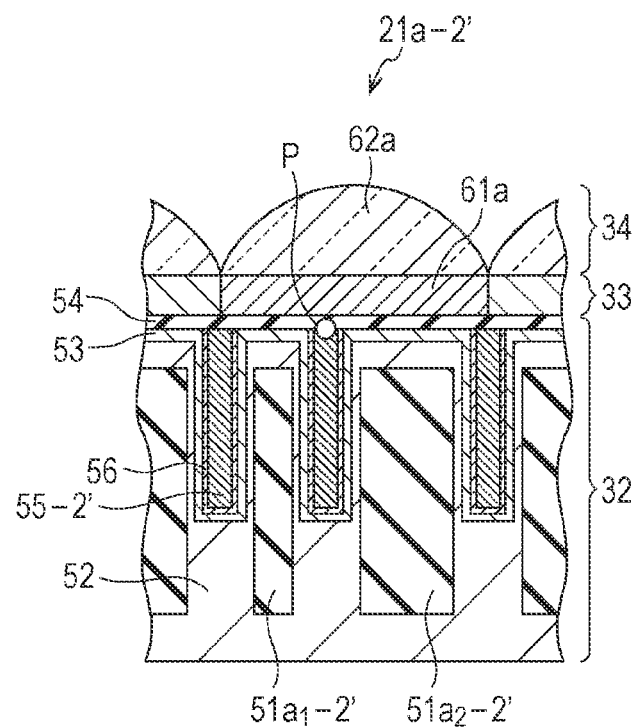

Next, FIGS. 13A and 13B illustrate a modified example of the phase difference pixel 21a. FIG. 13A illustrates a phase difference pixel 21a' which is a modified example of the phase difference pixel 21a illustrated in FIGS. 2A and 2B, and FIG. 13B illustrates the phase difference pixel 21a-2' which is a modified example of the phase difference pixel 21a-2 illustrated in FIGS. 4A and 4B.

In the phase difference pixel 21a of FIGS. 2A and 2B, the PDs 51a₁ and 51a₂ are separated in the center of the phase difference pixel 21a, and the engraved light shielding film 55 is formed in the center of the phase difference pixel 21a. In contrast, as illustrated in FIG. 13A, in the phase difference pixel 21a', the PDs 51a₁' and 51a₂' are separated at a position shifted from the center of the phase difference pixel 21a', and engraved light shielding film 55 is formed at a position shifted from the center of the phase difference pixel 21a.

Here, the pupil position of an optical system that condenses light to the solid-state imaging device 11 varies depending on the arrangement position of the phase difference pixel 21a in the pixel array unit 12. For example, the pupil position is the center of the phase difference pixel 21a in the vicinity of the center of the pixel array unit 12, and the pupil position is a position shifted from the center of the phase difference pixel 21a as being close to the vicinity of the end portion of the pixel array unit 12. Accordingly, in the phase difference pixel 21a' disposed in the vicinity of the end portion of the pixel array unit 12, the position at which PDs 51a₁' and 51a₂' are divided is corrected depending on the pupil position.

In the phase difference pixel 21a' illustrated in FIG. 13A, the position at which PDs 51a₁' and 51a₂' are divided is a position deviated from the center, depending on the pupil position P, and the engraved light shielding film 55 is formed in a region at which the PDs 51a₁' and 51a₂' are divided. Accordingly, respective sizes of the PDs 51a₁' and 51a₂' which are divided are different.

However, since the smaller one of the PDs 51a₁' and 51a₂' has a shorter distance through which light passes, the light tends to leak to other adjacent pixels 21.

Thus, as illustrated in FIG. 13B, in a phase difference pixel 21a-2', an engraved light shielding film 55-2' is formed in a region in which the PDs 51a₁' and 51a₂' are divided and the phase difference pixel 21a-2' and other adjacent pixels 21 are divided. Thus, as illustrated, it is possible to prevent light from leaking from the PD 51a₁-2' which is formed to be smaller to other adjacent pixels 21.

Further, the solid-state imaging device 11 described above can be applied to various electronic apparatuses including imaging systems such as digital still cameras and digital video cameras, mobile phones with an imaging function, or other apparatuses with an imaging function.

Figure 14:
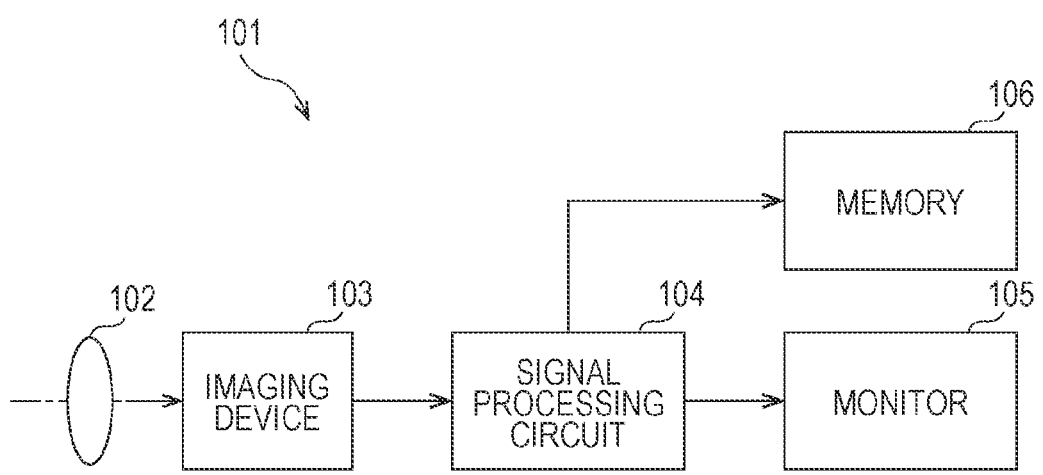
FIG. 14 is a block diagram illustrating a configuration example of an imaging apparatus mounted on an electronic apparatus.

FIG. 14 is a block diagram illustrating a configuration example of an imaging apparatus mounted on an electronic apparatus.

As illustrated in FIG. 14, an imaging apparatus 101 is configured to include an optical system 102, an imaging device 103, a signal processing circuit 104, a monitor 105, and a memory 106, and is capable of capturing still images and moving images.

The optical system 102 is configured to include one or a plurality of lenses, and guides image light (incident light) from an object to the imaging device 103 so as to form an image on a light receiving surface (sensor unit) of the imaging device 103.

As the imaging device 103, a solid-state imaging device 11 including phase difference pixels 21a of various configuration examples described above is applied. Electrons are accumulated in the imaging device 103 for a fixed period, according to an image formed on the light receiving surface through the optical system 102. Thus, signals according to the electrons accumulated in the imaging device 103 are supplied to the signal processing circuit 104.

The signal processing circuit 104 performs various signal processes on the pixel signals which are output from the imaging device 103. The image (image data) obtained by the signal processing circuit 104 performing the signal processes is supplied to and displayed on the monitor 105, or is supplied to and stored (recorded) in the memory 106.

In the imaging apparatus 101 configured in this manner, it is possible to achieve a better phase difference characteristic and to obtain a reliably focused image by applying the solid-state imaging device 11 including the phase difference pixel 21a of various configuration examples described above.

In addition, the present technology may have the following configurations.

(1)

A solid-state imaging device including:

a plurality of pixels each of which includes a photoelectric conversion unit that generates charges by photoelectrically converting light; and a transistor that reads a pixel signal of a level corresponding to the charges generated in the photoelectric conversion unit, in which a phase difference pixel which is at least a part of the plurality of pixels is configured in such a manner that the photoelectric conversion unit is divided into a plurality of photoelectric conversion units and an insulated light shielding film is embedded in a region for separating the plurality of photoelectric conversion units, which are divided, from each other.

(2)

The solid-state imaging device according to (1), in which the phase difference pixel is configured by further embedding the light shielding film in a region for separating the phase difference pixel and other adjacent pixels.

(3)

The solid-state imaging device according to (1) or (2), in which a white filter is disposed corresponding to the phase difference pixel, in a color filter layer laminated on a sensor layer in which the photoelectric conversion unit is formed.

(4)

The solid-state imaging device according to any one of (1) to (3), in which the phase difference pixel is configured by dividing the photoelectric conversion unit into two.

(5)

The solid-state imaging device according to any one of (1) to (4), in which the phase difference pixel is configured by dividing the photoelectric conversion unit into four.

(6)

The solid-state imaging device according to (5), in which a phase difference detection is performed based on the pixel signals corresponding to charges generated in a pair of the photoelectric conversion units disposed in an oblique direction, among the four photoelectric conversion units which are divided.

(7)

The solid-state imaging device according to (5) or (6), in which a phase difference detection is performed based on the pixel signals corresponding to charges generated in a pair of the photoelectric conversion units disposed in a vertical direction or a horizontal direction, among the four photoelectric conversion units which are divided.

(8)

The solid-state imaging device according to any one of (1) to (7), further including:

a charge detection unit that temporarily accumulates charges that are transferred from the photoelectric conversion unit and converts the charges into a voltage, in which charges from the plurality of photoelectric conversion units which are divided are simultaneously transferred to the charge detection unit, and the charges are added in the charge detection unit.

(9)

The solid-state imaging device according to (8), further including:

a switching transistor that switches a conversion efficiency for converting charges into a voltage in the charge detection unit.

(10)

The solid-state imaging device according to any one of (1) to (9), in which the positions in which the photoelectric conversion unit is divided into a plurality of photoelectric conversion units are corrected according to an arrangement position of the phase difference pixel.

(11)

The solid-state imaging device according to any one of (1) to (10), in which the phase difference pixels are disposed entirely in a pixel array unit in which the pixels are disposed in an array shape.

(12)

An electronic apparatus including:

a solid-state imaging device including a plurality of pixels each of which includes a photoelectric conversion unit that generates charges by photoelectrically converting light; and a transistor that reads a pixel signal of a level corresponding to the charges generated in the photoelectric conversion unit, in which a phase difference pixel which is at least a part of the plurality of pixels is configured in such a manner that the photoelectric conversion unit is divided into a plurality of photoelectric conversion units and an insulated light shielding film is embedded in a region for separating the plurality of photoelectric conversion units, which are divided, from each other.

It should be understood that the disclosure is not limited to the above-described embodiments, but may be modified into various forms in a range without departing from a gist of the disclosure.

What is claimed is:

1. An imaging device comprising:
   a phase difference pixel including:
      a microlens;
      a first photoelectric conversion structure configured to receive light through the microlens;
      a second photoelectric conversion structure configured to receive light through the microlens;
      a first transfer transistor corresponding to the first photoelectric conversion structure; and
      a second transfer transistor corresponding to the second photoelectric conversion structure,
   wherein an insulated light shielding film is embedded in a region between the first photoelectric conversion structure and the second photoelectric conversion structure, and
   wherein the region the insulated light shielding film is embedded in is shifted according to a pupil position.

2. The imaging device according to claim 1,
   wherein the microlens overlaps the first and second photoelectric conversion structures.

3. The imaging device according to claim 1,
   wherein a white filter is disposed corresponding to the phase difference pixel.

4. The imaging device according to claim 1,
   wherein the phase difference pixel further includes a third photoelectric conversion structure and a fourth photoelectric conversion structure.

5. An imaging device comprising:
   a phase difference pixel including:
      a microlens;
      a first photoelectric conversion structure configured to receive light through the microlens;
      a second photoelectric conversion structure configured to receive light through the microlens; and
      a metal film,
   wherein the metal film is embedded in a region between the first photoelectric conversion structure and the second photoelectric conversion structure, and
   wherein the region the metal film is embedded in is shifted according to a pupil position.

6. The imaging device according to claim 5,
   wherein the microlens overlaps the first and second photoelectric conversion structures.

7. The imaging device according to claim 5,
   wherein a white filter is disposed corresponding to the phase difference pixel.

8. The imaging device according to claim 5,
   wherein the phase difference pixel further includes a third photoelectric conversion structure and a fourth photoelectric conversion structure.

9. An imaging device comprising:
   a pixel array unit including a first pixel; and
   a column processing unit, wherein the first pixel includes:
   a microlens;
   a first transfer transistor;
   a second transfer transistor;
   a floating diffusion region;
   a first photoelectric conversion element configured to receive light through the microlens and coupled to the floating diffusion region via the first transfer transistor;

a second photoelectric conversion element configured to receive light through the microlens and coupled to the floating diffusion region via the second transfer transistor; and a trench region disposed between the first photoelectric conversion element and the second photoelectric conversion element, wherein an insulated light shield is embedded in the trench region, wherein the first pixel is arranged at a distance from a center of the pixel array unit, and wherein the trench region is shifted from a center of the first pixel according to a pupil position.

10. The imaging device according to claim 9, further comprising a fixed charge film formed on the first photoelectric conversion element and the second photoelectric conversion element, wherein the fixed charge film is embedded in the trench region.

11. The imaging device according to claim 9, further comprising an insulating film formed on the first photoelectric conversion element and the second photoelectric conversion element, wherein the insulating film is embedded in the trench region.

12. The imaging device according to claim 10, further comprising a metal material forming an engraved light shielding film and a barrier metal formed between the engraved light shielding film and the fixed charge film in the trench region.

13. The imaging device according to claim 9, wherein the trench region of the first pixel is formed into a "cross" shape in a plan view.

14. The imaging device according to claim 9, wherein the trench region of the first pixel is formed into a "square with a cross in the center" shape in a plan view.

15. The imaging device according to claim 9, wherein the pixel array unit further comprises a second pixel adjacent to the first pixel, and wherein a trench region is disposed between the first pixel and the second pixel.

16. The imaging device according to claim 15, wherein the second pixel does not include a trench region.

17. The imaging device according to claim 9, wherein a light receiving area of the second photoelectric conversion element is larger than a light receiving area of the first photoelectric conversion element in the first pixel.

* * * * *